(12) United States Patent
Kato et al.

(10) Patent No.: US 12,137,547 B2
(45) Date of Patent: Nov. 5, 2024

(54) WIRING MODULE

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Yuriya Kato, Mie (JP); Kosuke Sone, Mie (JP); Ai Takehisa, Mie (JP); Takuya Taniguchi, Mie (JP)

(73) Assignees: AutoNetworks Technologies, Ltd., Mie (JP); Sumitomo Wiring Systems, Ltd, Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 121 days.

(21) Appl. No.: 17/910,246

(22) PCT Filed: Mar. 8, 2021

(86) PCT No.: PCT/JP2021/008948
§ 371 (c)(1),
(2) Date: Sep. 8, 2022

(87) PCT Pub. No.: WO2021/192957
PCT Pub. Date: Sep. 30, 2021

(65) Prior Publication Data
US 2023/0092806 A1  Mar. 23, 2023

(30) Foreign Application Priority Data
Mar. 26, 2020 (JP) .................................. 2020-055899

(51) Int. Cl.
H05K 9/00 (2006.01)
B60R 16/02 (2006.01)
H01B 5/14 (2006.01)

(52) U.S. Cl.
CPC ....... *H05K 9/0098* (2013.01); *B60R 16/0215* (2013.01); *H01B 5/14* (2013.01)

(58) Field of Classification Search
CPC .................................................. H05K 9/0098
See application file for complete search history.

(56) References Cited

U.S. PATENT DOCUMENTS 5,876,090 A    3/1999   Kawaguti
11,208,058 B2 * 12/2021 Yamaguchi ......... B60R 16/0215
(Continued)

FOREIGN PATENT DOCUMENTS

JP    58-074719 U    5/1983
JP    61-194218 U    12/1986
(Continued)

OTHER PUBLICATIONS

International Search Report issued in International Patent Application No. PCT/JP2021/008948, dated May 18, 2021, along with an English translation thereof.
(Continued)

Primary Examiner — Hung V Ngo
(74) Attorney, Agent, or Firm — Greenblum & Bernstein, P.L.C.

(57) ABSTRACT

A wiring module includes: a functional sheet disposed between a panel and an interior member in a vehicle; a transmission member disposed on one surface side of the functional sheet; and a conductive sheet covering a part of the transmission member. The functional sheet includes a conductive layer and a layer having a function of at least one of a thermal adjustment function or a sound insulation function, and the conductive sheet is electrically connected to the conductive layer.

7 Claims, 6 Drawing Sheets

(56) References Cited

U.S. PATENT DOCUMENTS

2017/0158170 A1 6/2017 Gerdes et al.
2019/0392963 A1 12/2019 Ishida et al.
2021/0210250 A1 7/2021 Nishimura et al.

FOREIGN PATENT DOCUMENTS

| JP | 2001-352636 | 12/2001 |
| JP | 2001-357737 | 12/2001 |
| JP | 2002-314213 | 10/2002 |
| JP | 2014-204485 | 10/2014 |
| JP | 2016-120759 | 7/2016 |
| JP | 2018-137208 | 8/2018 |
| JP | 2019-204743 | 11/2019 |
| JP | 2019-207816 | 12/2019 |
| WO | 2018/155166 | 8/2018 |

OTHER PUBLICATIONS

International Preliminary Report on Patentability issued in International Patent Application No. PCT/JP2021/008948, dated Oct. 6, 2022, along with an English translation thereof.
Japan Office Action issued in Japan Patent Application No. 2020-55899, dated Jun. 27, 2023, together with English translation thereof.
Japan Office Action issued in Japan Patent Application No. 2023-180025, dated Apr. 30, 2024, together with English translation thereof.
Japan Office Action issued in Japan Patent Application No. 2023-180025, dated Sep. 17, 2024, together with English translation thereof.

* cited by examiner

WIRING MODULE

TECHNICAL FIELD

The present disclosure relates to a wiring module.

BACKGROUND ART

Patent Document 1 discloses a wiring member in which electrical wires intersect with each other and are wired on a sheet material.

PRIOR ART DOCUMENTS

Patent Documents

Patent Document 1: Japanese Patent Application Laid-Open No. 2019-207816

SUMMARY

Problem to be Solved by the Invention

Noise may occur in the electrical wires in the wiring member in which the electrical wires are disposed along the sheet material, and noise such as crosstalk may occur between a plurality of electrical wires.

An object is to provide a technique capable of simply suppressing noise occurring in a transmission member in a wiring module in which a transmission member is disposed along a sheet.

Means to Solve the Problem

A wiring module according to the present disclosure is a wiring module including: a functional sheet disposed between a panel and an interior member in a vehicle; a transmission member disposed on one surface side of the functional sheet; and a conductive sheet covering a part of the transmission member, wherein the functional sheet includes a conductive layer and a layer having a function of at least one of a thermal adjustment function or an acoustic insulation function, and the conductive sheet is electrically connected to the conductive layer.

Effects of the Invention

According to the present disclosure, noise occurring in a transmission member in a wiring module in which a transmission member is disposed along a sheet can be simply suppressed.

DESCRIPTION OF EMBODIMENT(S)

Description of Embodiment of Present Disclosure

Figure 1:
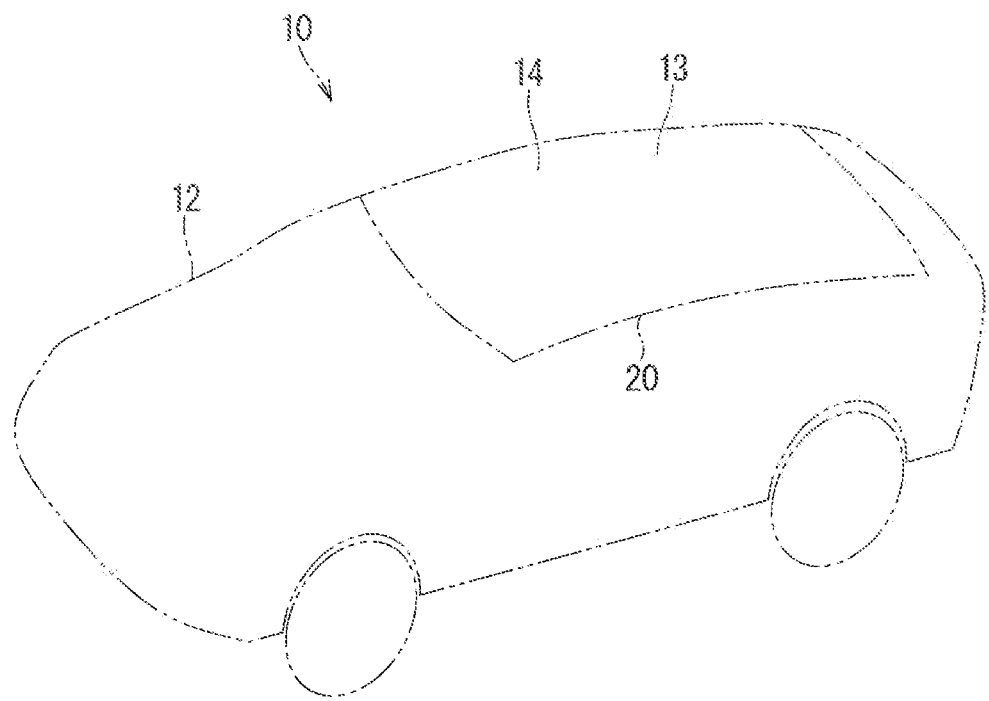
FIG. 1 is a schematic perspective view illustrating a vehicle into which a wiring module is incorporated.

Embodiments of the present disclosure are listed and described firstly.

A wiring module according to the present disclosure is as follows.

(1) A wiring module includes: a functional sheet disposed between a panel and an interior member in a vehicle; a transmission member disposed on one surface side of the functional sheet; and a conductive sheet covering a part of the transmission member, wherein the functional sheet includes a conductive layer and a layer having a function of at least one of a thermal adjustment function or a sound insulation function, and the conductive sheet is electrically connected to the conductive layer. Accordingly, the conductive sheet covering a part of the transmission member is electrically connected to the conductive layer in the functional sheet, thus noise occurring in the transmission member can be simply suppressed by the functional sheet and the conductive sheet.

(2) In the wiring module according to (1), the conductive layer may be provided with a vehicle body side connection part which can be electrically connected to a metal part in a vehicle body. Accordingly, the conductive sheet and the functional sheet can be connected to the metal part of the vehicle body, and shielding effect of the conductive sheet and the functional sheet is increased.

(3) It is also applicable that the wiring module according to (1) or (2) further includes a second transmission member disposed on one surface side of the functional sheet, wherein the conductive sheet is provided between the transmission member and the second transmission member. Accordingly, the conductive sheet partitions the transmission member and the second transmission member, thus noise between the transmission member and the second transmission member is simply suppressed.

(4) In the wiring module according to (3), it is also applicable that the transmission member and the second transmission member intersect at an intersection part, and the conductive sheet intervenes between the transmission member and the second transmission member in the intersection part. Accordingly, noise such as crosstalk between the transmission member and the second transmission member can be simply suppressed also in the intersection part.

(5) In the wiring module according to any one of (1) to (4), wherein the conductive sheet may be provided by bending a part of a conductive layer of a sheet constituting the functional sheet. The conductive sheet and the functional sheet are made by one sheet, thus an electrical connection state of the conductive sheet and the functional sheet is stabilized. A connection member electrically connecting the conductive sheet and the functional sheet can be omitted in a portion where one sheet is bended, thus increase in the number of components can be suppressed in the wiring member.

(6) It is also applicable that the wiring module according to any one of (1) to (5) further includes an attachment formed by a material having conductivity, wherein the attachment includes a first contact part and a second contact part mutually connected to each other, the first contact part has contact with the conductive sheet, and the second contact part has contact with the conductive layer, thereby fixing the functional sheet and the conductive sheet. Accordingly, the functional sheet and the conductive sheet are electrically connected via the attachment. A member electrically connecting the functional sheet and the conductive sheet needs not be provided in addition to the attachment.

(7) It is also applicable that in the wiring module according to any one of (1) to (6), wherein a connector provided in an end portion of the transmission member is disposed on the functional sheet, and the conductive sheet covers at least a portion of the connector from which the transmission member extends. Accordingly, noise occurring in the transmission member connected to the connector can also be suppressed easily.

Details of Embodiment of Present Disclosure

Specific examples of a wiring module of the present disclosure are described hereinafter with reference to the drawings. The present disclosure is not limited to these examples, but is indicated by claims, and it is intended that meanings equivalent to claims and all modifications within a scope of claims are included.

Embodiment 1

A wiring module according to an embodiment 1 is described hereinafter.
<Vehicle into which Wiring Module is Incorporated>
FIG. 1 is a schematic perspective view illustrating a vehicle 10 into which a wiring module 20 is incorporated. The vehicle 10 includes a body 12. The body 12 is a part forming an outline of the vehicle 10. The body 12 may be a monocoque body or a body mounted on a ladder type frame. Herein, the body 12 includes a lateral panel surrounding a vehicle interior, a roof panel 13, a boarding door panel for a passenger to get in or out of a vehicle, and a rear door panel to take in and out a luggage, for example. The body 12 may be formed by metal or resin. The body 12 may also be made of a combination of metal and resin. A plate-like part of the body 12 covering an upper side of the vehicle interior constitutes the roof panel 13. The roof panel 13 may be partially or wholly curved to form an appearance shape of the body 12. The roof panel 13 may be formed by metal or resin. The roof panel 13 may also be made of a combination of metal and resin. Herein, an antenna hole 13h is formed in the roof panel 13 (refer to FIG. 2).

The wiring module 20 is incorporated into the vehicle 10. The wiring module 20 is provided between the panel and the interior member. In the example described in the present embodiment, the wiring module 20 is incorporated into a roof 14 including the roof panel 13. The wiring module 20 may also be incorporated into the other member in the vehicle 10 such as a boarding door, a rear door, and an installment panel, for example.

Figure 2:
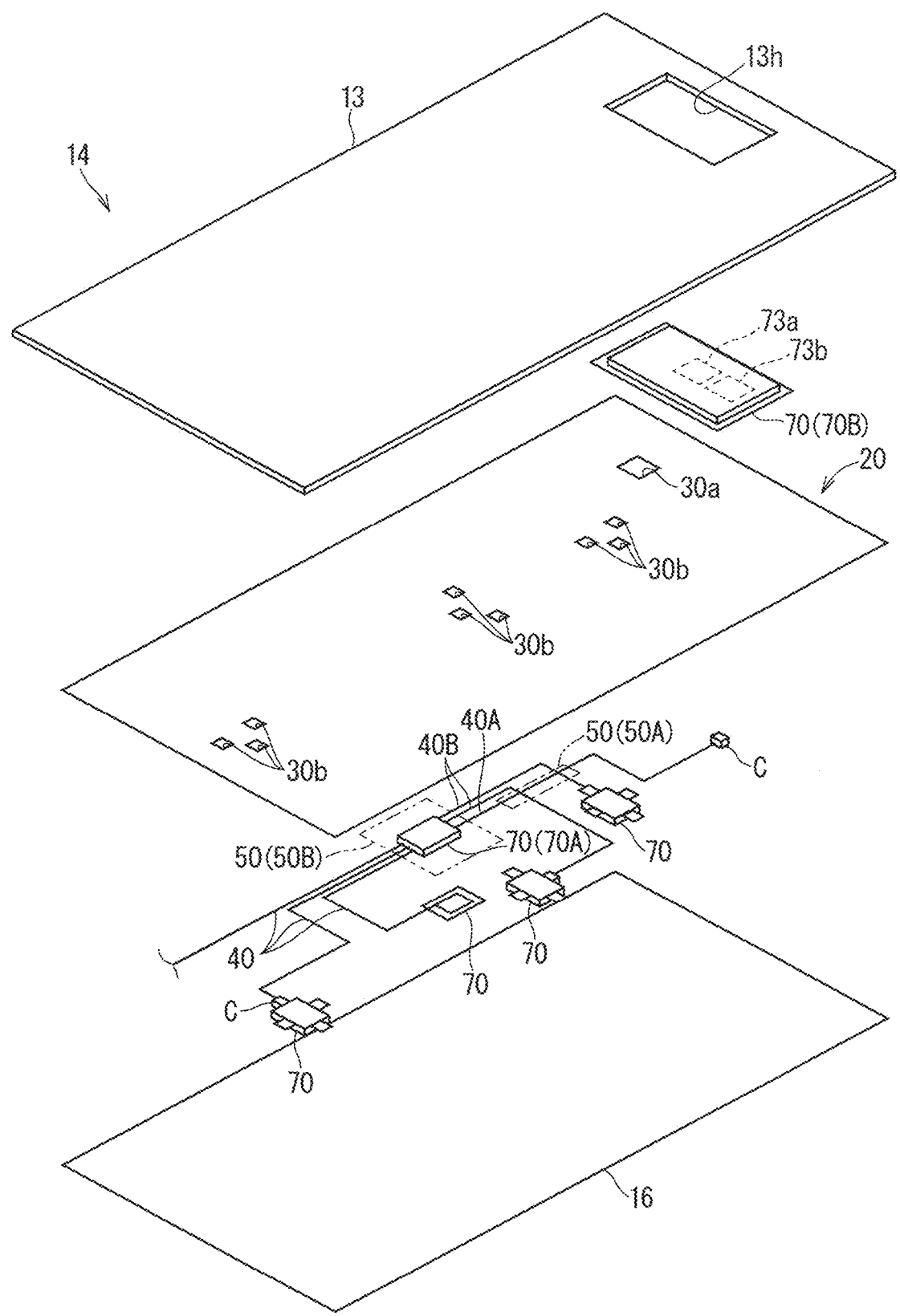
FIG. 2 is an exploded perspective view illustrating a wiring module according to an embodiment 1.
Figure 3:
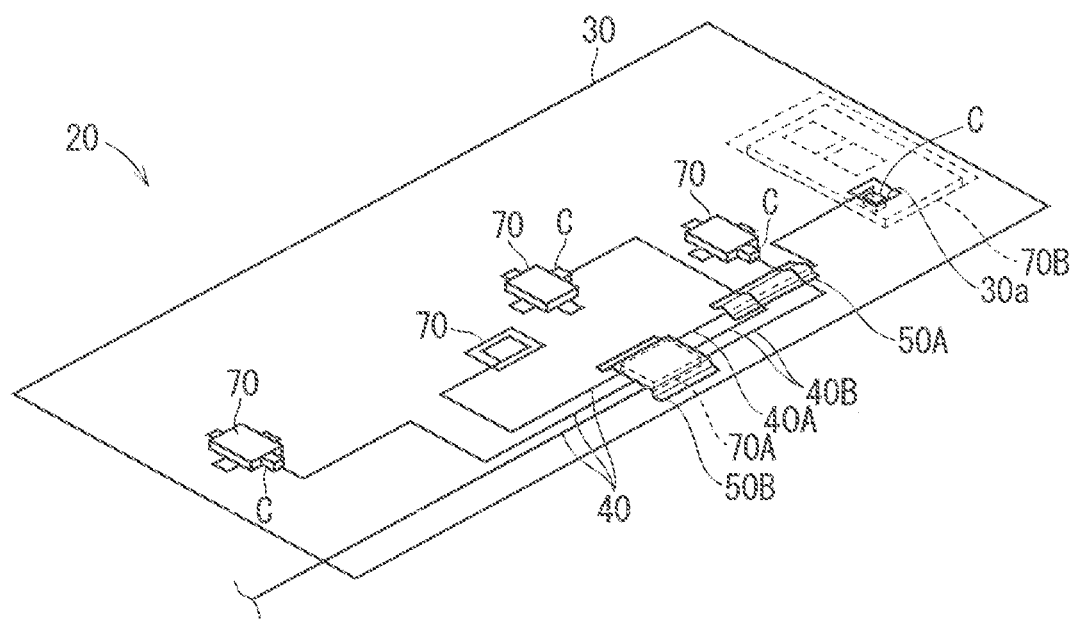
FIG. 3 is a perspective view illustrating the wiring module according to the embodiment 1.

FIG. 2 is an exploded perspective view illustrating the wiring module 20 according to the embodiment 1. FIG. 3 is a perspective view illustrating the wiring module 20 according to the embodiment 1. FIG. 2 is a drawing of the wiring module 20 viewed from an obliquely upper side, and FIG. 3 is a drawing of the wiring module 20 viewed from an obliquely lower side.

FIG. 2 illustrates the roof 14. The roof panel 13 described above and an interior member 16 are illustrated as the roof 14. The interior member 16 is a plate-like member formed of resin, for example. The interior member 16 may be partially or wholly curved to form a ceiling shape of the vehicle interior. The interior member 16 is attached to a lower side of the roof panel 13. The interior member 16 is a part exposed to the vehicle interior. The interior member 16 is also referred to as a roof liner in some cases. In the present embodiment, the wiring module 20 is provided between the roof panel 13 and the interior member 16.
<Whole Structure of Wiring Module>
The wiring module 20 includes a functional sheet 30, an electrical wire 40, and a conductive sheet 50.

The functional sheet 30 is incorporated into the roof 14 to planarly extend over the roof 14. For example, the functional sheet 30 may be disposed to cover 80% or more of an area of the roof 14. For example, the functional sheet 30 may be disposed to extend over a whole upper side of head rests of a plurality of passenger seats in the vehicle. The functional sheet 30 is disposed to extend over the roof 14, thus the electrical wire 40, for example, can be fixed to the roof 14 in a region as large as possible. The function of the functional sheet 30 can be performed on a region in the roof 14 as large as possible.

The electrical wire 40 is disposed along the functional sheet 30. The electrical wire 40 is connected to an apparatus 70 disposed on the roof 14. The electrical wire 40 extends along a predetermined route to be able to be connected to the apparatus 70. The apparatus 70 transmits or receives an electrical signal via the electrical wire 40. Alternatively, the apparatus 70 receives a power supply or distributes electrical power via the electrical wire 40. The electrical wire 40 and the apparatus 70 are connected to each other via a connector C in some cases. It is also applicable that the electrical wire 40 is directly introduced in the apparatus 70 without an intervention of the connector C to be directly connected to an electrical element in the apparatus 70. Assumed as the apparatus 70 are, for example, an electronic control unit, a lamp (particularly, a map lamp and an interior lamp), a speaker, an interior camera, a monitor, a projection apparatus, an external communication antenna, and an interior-side antenna. In the description, an apparatus 70A in FIG. 2 is an electronic control unit. The electronic control unit. 70A is an apparatus controlling each apparatus 70 mounted to the roof 14 while communicating with the other electronic control unit provided in the vehicle 10. In the description, an apparatus 70B in FIG. 2 is an external communication antenna unit. The external communication antenna unit 70B is an apparatus performing wireless communication between the vehicle 10 and an external apparatus or the other vehicle.

Herein, the plurality of electrical wires 40 are included. The plurality of electrical wires 40 are disposed along a route from the electronic control unit 70A toward a front side and each of a plurality of routes from the electronic control unit 70A toward the apparatus 70.

The electrical wire 40 located along the route from the electronic control unit 70A toward the front side is attached to the functional sheet 30 in a region of the functional sheet 30, thereby being held alarm a constant route. The electrical wire 40 located along the route from the electronic control unit 70A toward the front side extends from a front part of the functional sheet 30 to an outer side. The electrical wire 40 is disposed along an A pillar in the vehicle 10, for example, and connected to the other electronic control unit and a power source in the vehicle 10.

The plurality of electrical wires 40 located along the plurality of routes from the electronic control unit 70A toward the plurality of apparatuses 70 is attached to the functional sheet 30, thereby being held along a constant route. The route of the plurality of electrical wires 40 is optionally set.

The conductive sheet 50 is overlapped with the functional sheet 30. The conductive sheet 50 electromagnetically shields the electrical wire 40. In the description herein, the conductive sheet 50 is partially overlapped with the functional sheet 30.

It is preferable that the routes of the plurality of electrical wires 40 do not intersect with each other. When the routes of the plurality of electrical wires 40 do not intersect with each other, increase in a thickness of the wiring module 20 by an intersection part thereof is suppressed. A noise problem such as crosstalk occurring between the electrical wires 40 in the intersection part is suppressed. However, the intersection part may occur depending on the routes of the plurality of electrical wires 40 in some cases. In this case, the conductive sheet 50 is provided in the intersection part, thus the noise problem hardly occurs between the electrical wires 40 in the intersection part.

<Each Unit in Wiring Module>

Figure 4:
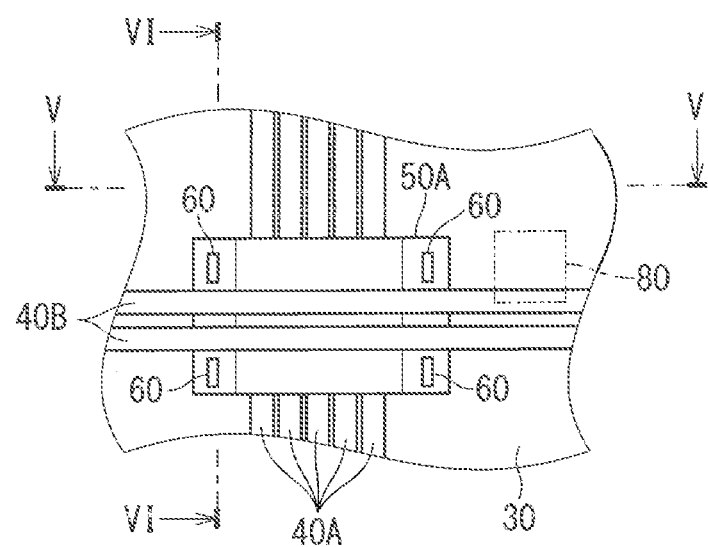
FIG. 4 is an enlarged plan view of a part of FIG. 3.
Figure 5:
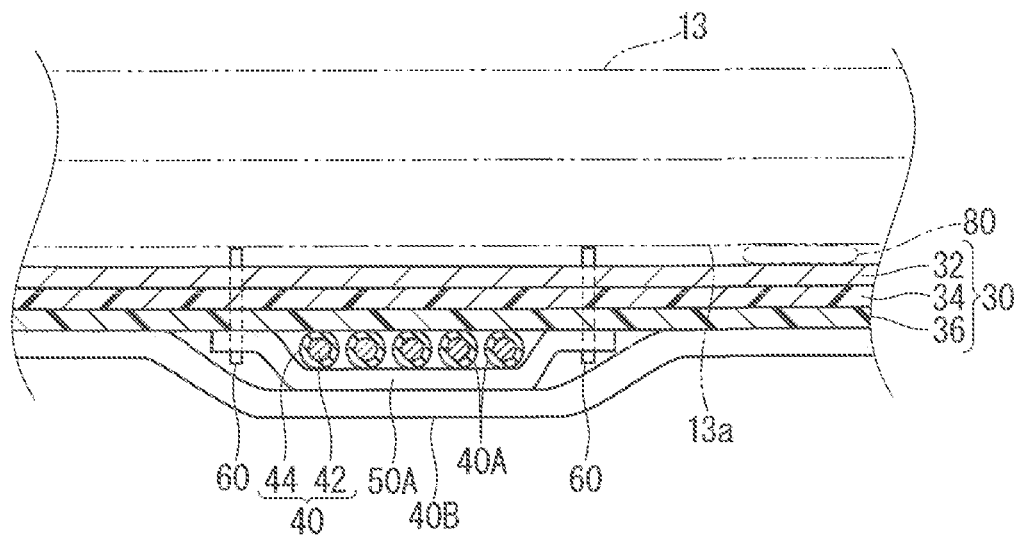
FIG. 5 is a cross-sectional view of the wiring module cut along a V-V line in FIG. 4.
Figure 6:
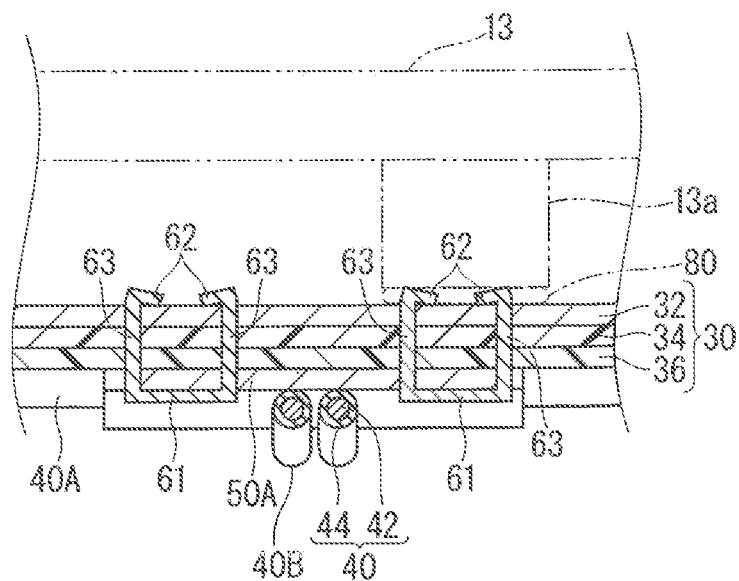
FIG. 6 is a cross-sectional view of the wiring module cut along a VI-VI line in FIG. 4.
Figure 7:
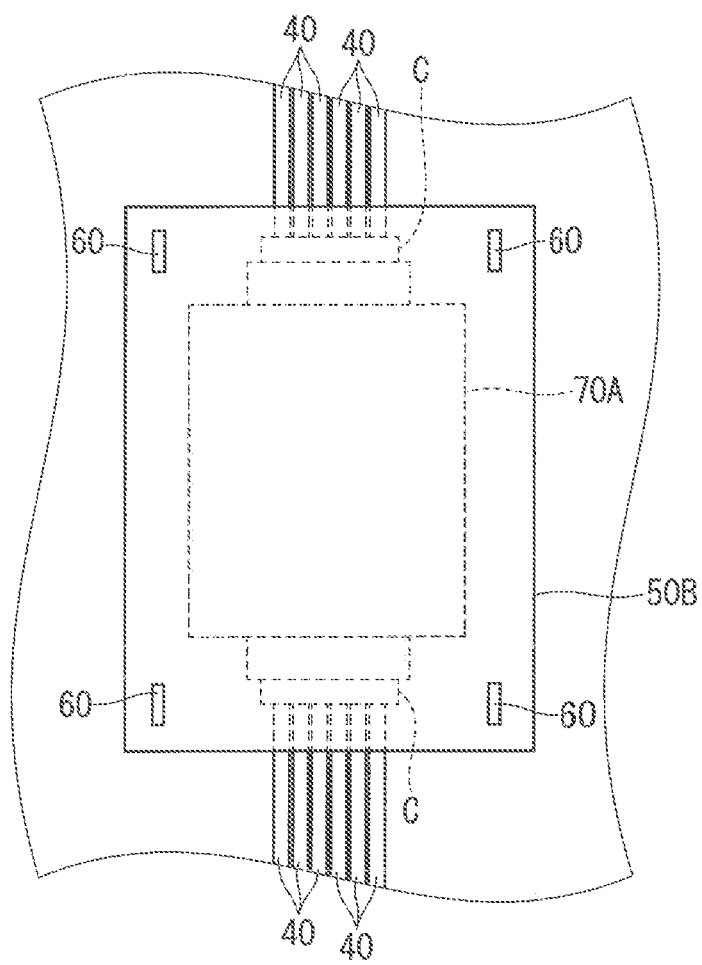
FIG. 7 is an enlarged plan view of the other part of FIG. 3.

Each unit in the wiring module 20 is described in more detail also with reference to FIG. 4 to FIG. 7 in addition to FIG. 1 to FIG. 3. FIG. 4 is an enlarged plan view of a part of FIG. 3. FIG. 5 is a cross-sectional view of the wiring module cut along a V-V line in FIG. 4. FIG. 6 is a cross-sectional view of the wiring module cut along a VI-VI line in FIG. 4. FIG. 7 is an enlarged plan view of the other part of FIG. 3.

<Functional Sheet>

The functional sheet 30 includes a conductive layer 32, an acoustic insulation layer 34, and a thermal adjustment layer 36 as illustrated in FIG. 5. The conductive layer 32, the acoustic insulation layer 34, and the thermal adjustment layer 36 are stacked in this order. The conductive layer 32 is an outermost layer in the functional sheet 30. When the functional sheet 30 has a multilayer structure of three or more layers, an order of overlapping a plurality of layers including the conductive layer 32 is optionally set, thus the a plurality of layer may be stacked so that the conductive layer 32 is located as an intermediate layer, for example. The functional sheet 30 is disposed so that the conductive layer 32 is located as an uppermost layer while being disposed in the vehicle 10. The functional sheet 30 may be disposed so that the conductive layer 32 is located as a lowermost layer while being disposed in the vehicle 10.

The conductive layer 32 is a radio wave shielding layer having a radio wave shielding function, for example. The radio wave shielding layer is a layer suppressing a radio wave transmission between one surface side and the other surface side of the functional sheet 30. The radio wave shielding layer may be a layer formed of metal such as aluminum or iron evenly extending therebetween.

The acoustic insulation layer 34 is a layer having an acoustic insulation function. The acoustic insulation layer 34 is a layer suppressing a sound transmission between one surface side and the other surface side of the functional sheet 30. The acoustic insulation layer 34 may reflect sound or absorb energy of sound as heat energy. Specifically, a sheet including minute spaces such as a non-woven sheet or a foam sheet, for example, may be used as the acoustic insulation layer 34. A sound absorbing coating may be used as the acoustic insulation layer 34.

The thermal adjustment layer 36 is a layer having a thermal adjustment function. The thermal adjustment layer 36 is a layer adjusting heat passing between one surface side and the other surface side of the functional sheet 30 on an interior side. The thermal adjustment layer 36 may be a layer suppressing a heat transmission between one surface side and the other surface side of the functional sheet 30. The thermal adjustment layer 36 may be a layer having lower thermal conductivity than the other layer. The thermal adjustment layer 36 may be a layer reflecting heat radiation energy. The thermal adjustment layer 36 may be a layer reflecting heat energy. Specifically, a sheet including minute spaces such as a non-woven sheet or a foam sheet, for example, may be used as the thermal adjustment layer 36. A heat insulating coating, a heat shielding coating, or a heat radiation coating may be used as the thermal adjustment layer 36.

A configuration that the functional sheet 30 includes both the acoustic insulation layer 34 and the thermal adjustment layer 36 is not necessary. The functional sheet 30 may include only one of the acoustic insulation layer 34 and the thermal adjustment layer 36. It is also applicable that the functional sheet 30 includes one layer having both the thermal adjustment function and the acoustic insulation function in place of the acoustic insulation layer 34 and the thermal adjustment layer 36. For example, the layer made up of a non-woven sheet can have functions as a thermal adjustment layer and an acoustic insulation layer.

The layers may be simply overlapped with each other. The layers may be fixed to each other by a double-sided tape, an adhesive agent, or welding, for example. When the layers are fixed to each other, they may be wholly fixed or only a part of surfaces thereof may be fixed.

Herein, the functional sheet 30 also has a function of fixing a member such as the electrical wire 40 or the apparatus 70 disposed on the functional sheet 30.

<Electrical Wire>

The electrical wire 40 is an example of a transmission member. The electrical wire 40 may be a single-core wire, or may also be a compound body of a plurality of multicore wires. The single-core wire may be a general single-core wire having a core wire 42 and a covering layer 44 around the core wire 42, or may also be a bare conductive wire, a shielded wire, an enamel wire, a nichrome wire, or a coaxial wire, for example. The compound body of the plurality of single-core wires may be a cable with a sheath, or may also be a cable with no sheath. The cable with the sheath includes a plurality of single-core wires and a sheath covering the plurality of single-core wires. Adopted as the cable with no sheath is a cable made by twisting a plurality of single-core wires such as a twisted wire, for example. The electrical wire 40 may be various kinds of signal lines or various kinds of power lines, and is set in accordance with the apparatus 70.

The electrical wire 40 is attached to the functional sheet 30. The electrical wire 40 is preferably attached to be disposed along a constant route on the functional sheet 30, thus a specific configuration for fixation is not particularly limited. The electrical wire 40 may be attached to the conductive sheet. In this case, the electrical wire 40 can be fixed more firmly.

For example, the electrical wire 40 may be attached to one surface of the functional sheet 30. For example, the electrical wire 40 may be welded (or fussed) to one surface of the functional sheet 30. A welding part thereby formed has a configuration that a part of at least one of the electrical wire 40 or the functional sheet 30 is melted and adheres to the other side member. The electrical wire 40 and the functional sheet 30 may be welded by ultrasonic welding or thermal welding. It is also applicable that a surface of at least one of the electrical wire 40 or the functional sheet 30 is melted by a solvent to weld the electrical wire 40 and the functional sheet 30. For example, the electrical wire 40 may be attached to the functional sheet 30 by an adhesive agent or a double-sided tape, for example. For example, the electrical wire 40 may be sewn to the functional sheet 30 by a sewing thread. For example, it is also applicable that an adhesive tape is attached to extend across the electrical wire 40 from one surface side of the functional sheet 30 while the electrical wire 40 is disposed on one surface of the functional sheet 30, thus the electrical wire 40 is attached to one surface of the functional sheet 30.

The electrical wire 40 needs not be attached to only one surface of the functional sheet 30. The electrical wire 40 may include both a part attached to one surface of the functional sheet 30 and a part attached to the other surface of the functional sheet 30. In this case, the electrical wire 40 may be provided to pass from one surface toward the other surface in a middle portion or an end edge portion of the functional sheet 30.

For example, it is also applicable that the electrical wire 40 is sandwiched between two sheets, thereby being attached to the functional sheet 30. For example, in a case where the functional sheet 30 includes a plurality of layers, the electrical wire 40 may be sandwiched between sheets constituting each layer. In a case where the other sheet is overlapped with the functional sheet 30, the electrical wire 40 may be sandwiched between the functional sheet 30 and the other sheet. In this case, the two sheets sandwiching the electrical wire 40 may be attached by welding, or may also be attached by an adhesive agent or a double-sided tape. When the other sheet is overlapped with the functional sheet 30, the electrical wire may also be attached to the other sheet. The other sheet is overlapped, thus various types of wires can be routed in a state of being overlapped doubly or triply.

The plurality of electrical wires 40 include a first electrical wire 40A and a second electrical wire 40B. The first electrical wire 40A and the second electrical wire 40B intersect with each other in the intersection part. The first electrical wire 40A and the second electrical wire 40B are disposed on one surface side of the functional sheet 30. The conductive sheet 50 is provided between the first electrical wire 40A and the second electrical wire 40B. The first electrical wire 40A and the second electrical wire 40B are attached to the functional sheet 30.

As illustrated in FIG. 7, the connector C is disposed on the functional sheet 30. The connector C illustrated in FIG. 7 is connected to the electronic control unit 70A. An end portion of the electrical wire 40 is housed in the connector C.

<Conductive Sheet>

The conductive sheet 50 is formed into a sheet-like shape by a material having conductivity. The conductive sheet 50 is formed of metal such as aluminum or iron, for example. In the description herein, the conductive sheet 50 is a member having a single layer structure. The other sheet may be overlapped with the conductive sheet 50. For example, a sheet having the same lamination structure as the functional sheet 30 may be provided in place of the conductive sheet 50 having a single layer structure. In this case, a layer corresponding to the conductive layer in the sheet is a conductive sheet.

The conductive sheet 50 is electrically connected to the conductive layer 32 in the functional sheet 30. The conductive sheet 50 is provided to be partially overlapped with the functional sheet 30. Herein, the conductive sheet 50 is provided in two positions separated from each other. In the description hereinafter, when the two conductive sheets 50 need to be distinguished, one of them is referred to as the conductive sheet 50A and the other one of them is referred to as the conductive sheet 50B.

The conductive sheet 50A is provided between the first electrical wire 40A and the second electrical wire 40B. The conductive sheet 50A intervenes between the first electrical wire 40A and the second electrical wire 40B in the intersection part. Herein, the first electrical wire 40A passes through a region surrounded by the functional sheet 30 and the conductive sheet 50A. The second electrical wire 40B passes through an outer side of a region surrounded by the functional sheet 30 and the conductive sheet 50A. The second electrical wire 40B passes above the conductive sheet 50A. The second electrical wire 40B passes across the conductive sheet 50A. The second electrical wire 40B is attached to the functional sheet 30, but is not attached to the conductive sheet 50A The second electrical wire 40B is preferably attached to the functional sheet 30 in position on both sides of a portion passing across the conductive sheet 50A. The second electrical wire 40B may be attached to the conductive sheet 50A.

A combination of the first electrical wire 40A and the second electrical wire 40B partitioned by the conductive sheet 50A is not particularly limited, but can be appropriately set. For example, it is also applicable that the first electrical wire 40A is an electrical wire which can be a noise source such as a power source line and the second electrical wire 40B is an electrical wire which is easily influenced by noise such as a communication line. For example, it is also applicable that the first electrical wire 40A is an electrical wire which is easily influenced by noise such as a communication line and the second electrical wire 40B is an electrical wire which can be a noise source such as a power source line. In the example illustrated in FIG. 2, the first electrical wire 40A is a communication line connected to the external communication antenna unit 70B. The second electrical wire 40B is a power source line connected to the apparatus 70 such as a lamp different from an external communication unit, for example.

The conductive sheet 50B covers at least a portion of the connector C where the electrical wire 40 extends. Herein, the conductive sheet 50B also wholly covers the connector C and the apparatus 70A to which the connector C is connected.

The conductive sheet 50 is attached to the functional sheet 30 by an attachment 60. Accordingly, the wiring module 20 further includes the attachment 60.

<Attachment>

The attachment 60 attaches a portion where the functional sheet 30 and the conductive sheet 50 are overlapped with each other. The attachment 60 includes a first contact part 61 and a second contact part 62. The first contact part 61 and the second contact part 62 are mutually connected. Herein, the first contact part 61 and the second contact part 62 are connected via a connection part 63.

The first contact part 61 has contact with the conductive sheet 50. The second contact part 62 has contact with the conductive layer 32. Herein, the first contact part 61 presses the conductive sheet 50 against the functional sheet 30. The second contact part 62 is a pressing piece pressing the functional sheet 30 against the conductive sheet 50. However, it is sufficient that the first contact part 61 and the second contact part 62 have contact with the conductive sheet 50 and the conductive layer 32, respectively, thus need not be the pressing pieces. The connection part 63 passes through the functional sheet 30 and the conductive sheet 50.

Herein, the attachment 60 is formed by bending a rod-like member such as a wire as illustrated in FIG. 6. An intermediate portion of the rod-like member serves as the first contact part 61. One end portion and the other end portion of the rod-like member serves as the second contact part 62. A portion between the first contact part 61 and the second contact part 62 serves as the connection part 63. In contrast to the example illustrated in FIG. 6, it is also applicable that the intermediate portion of the rod-like member serves as the second contact part 62 and one end portion and the other end portion of the rod-like member serve as the first contact part 61. The attachment 60 may be a staple, for example. It is also applicable that both end portions of a U-like staple pass through the functional sheet 30 and the conductive sheet 50 and is then bonded and deformed to be the attachment 60. A piercing terminal, for example, may be adopted as the attachment 60 in which the connection part 63 passes through the functional sheet 30 and the conductive sheet 50.

The connection part 63 may not pass through the sheet. For example, the connection part may connect the first contact part 61 and the second contact part 62 on an outer side of an outer edge of the functional sheet 30 and the conductive sheet 50. A spring clip, for example, in which a connection part is formed into a spring shape may be adopted as the attachment 60.

The attachment 60 is a member in which the first contact part 61 and the second contact part 62 are integrated with each other before attaching the functional sheet 30 and the conductive sheet 50. The attachment may be a member separately formed before attaching the functional sheet 30 and the conductive sheet 50. It is preferable that the first contact part and the second contact part are mutually connected while the attachment attaches the functional sheet 30 and the conductive sheet 50. A bolt and a nut may be adopted as the attachment, for example.

<Electrical Connection Structure of Functional Sheet and Conductive Sheet>

The conductive layer 32 and the conductive sheet 50 are electrically connected in the functional sheet 30. The wiring module 20 includes an electrical connection part connecting the conductive layer 32 and the conductive sheet 50. The electrical connection part may be a direct connection part or an indirect connection part. The wiring module 20 may include one of or both the direct connection part and the indirect connection part.

The direct connection part is a portion where the conductive layer 32 and the conductive sheet 50 are directly connected to each other without an intervention of the other member. For example, when the conductive layer 32 and the conductive sheet 50 are formed by bending one conductive sheet, a bended portion in the conductive sheet is considered the direct connection part. For example, when the conductive layer 32 and the conductive sheet 50 have contact with each other, a contact portion where the conductive layer 32 and the conductive sheet 50 have contact with each other is considered the direct connection part. When the conductive layer 32 and the conductive sheet 50 have contact with each other, a contact state of the conductive layer 32 and the conductive sheet 50 may be kept by welding the conductive layer 32 and the conductive sheet 50. A holding member holding the conductive layer 32 and the conductive sheet 50 in a contact state may be provided. For example, the holding member may be a member sandwiching and pressing the functional sheet 30 and the conductive sheet 50 such as the attachment 60.

The indirect connection part is a portion where the conductive layer 32 and the conductive sheet 50 are indirectly connected to each other via the other member. In this case, the wiring module includes an electrical connection member connecting the conductive layer 32 and the conductive sheet 50.

Herein, the wiring module 20 includes the indirect connection part. Herein, the conductive layer 32 and the conductive sheet 50 are electrically connected via the attachment 60. Accordingly, the attachment 60 doubles as the electrical connection member. Specifically, the first contact part 61 has contact with the conductive sheet 50. The second contact part 62 has contact with the conductive layer 32. The first contact part 61 and the second contact part 62 are connected to each other. The attachment 60 is formed by a material having conductivity. Accordingly, the conductive layer 32 and the conductive sheet 50 are electrically connected via the attachment 60. Herein, the functional sheet 30 and the conductive sheet 50 are stacked so that the conductive layer 32 and the conductive sheet 50 are mutually directed outward, however, this configuration is not necessary. For example, the conductive layer 32 may be located in an intermediate layer in the functional sheet. Even in this case, when the second contact part 62 has contact with the conductive layer 32, the conductive layer 32 and the conductive sheet 50 can be electrically connected via the attachment 60.

The conductive layer 32 and the conductive sheet 50 electrically connected to each other serve as a radio wave shielding part in the wiring module 20. The radio wave shielding part is grounded on a metal part in a vehicle body while the wiring module 20 is assembled to the vehicle 10. A metal part in the vehicle body is also referred to as a body earth, for example.

<Ground Structure of Radio Wave Shielding Part and Body Earth>

The functional sheet 30 is located between the interior member 16 and the roof panel 13 while the wiring module 20 is assembled to the vehicle 10. The functional sheet 30 is attached so that the conductive layer 32 is directed to an outer side of the vehicle. The functional sheet 30 may be fixed to the interior member 16, for example, or may also be simply located on the interior member 16. For example, the functional sheet 30 may be fixed to the interior member 16 by a double-sided tape, an adhesive agent, or welding.

A vehicle body side connection part is provided on the conductive layer 32. The vehicle body side connection part is provided to be able to be electrically connected to the body earth. A configuration of the vehicle body side connection part is not particularly limited. Herein, a connection member 80 is provided as the vehicle body side connection part separately from the conductive layer 32. The connection member 80 is a conductive rubber or a conductive adhesive agent provided on the conductive layer 32, for example. The connection member 80 has direct contact with the body earth. The attachment 60 may be used as a connection member. That is to say, the second contact part 62 pressing the conductive layer 32 may have direct contact with the body earth.

The vehicle body side connection part may be a part of the conductive layer 32. For example, the vehicle body side connection part may be a conductive layer exposed part where the conductive layer 32 is exposed. In this case, the connective layer exposed portion has direct contact with the body earth.

However, a configuration that the vehicle body side connection part is provided on the conductive layer 32 is not necessary. For example, when the functional sheet 30 and the conductive sheet 50 are not grounded on the metal part of the vehicle body, the vehicle body side connection part needs not be provided on the conductive layer 32. For example, the vehicle body side connection part may be provided on the conductive sheet 50.

FIG. 5 and FIG. 6 illustrate an example that the vehicle body side connection part (the attachment 60 and the connection member 80 herein) has contact with the body earth. Specifically, in FIG. 5 and FIG. 6, a reinforcement bar 13a is provided on a vehicle interior side of the roof panel 13. The reinforcement bar 13a is formed of a metal material. The reinforcement bar 13a is also referred to as a stay or a beam in some cases. The reinforcement bar 13a is provided to extend in a vehicle width direction in the vehicle 10, for example. The plurality of reinforcement bars 13a are provided at intervals along a front-back direction, for example. The attachment 60 and the connection member 80 have contact with any of the reinforcement bars 13a. The attachment 60 and the connection member 80 are provided to be located below any of the reinforcement bars 13a. The attachment 60 and the connection member 80 have contact with a lower surface of the reinforcement bar 13a. The attachment 60 and the connection member 80 may have contact with a side surface of the reinforcement bar 13a. The metal part of the vehicle body is not limited to a body frame, but may be a body panel, for example. The vehicle body side connection part may have contact with the roof panel 13, for example.

A metal part 13a of the vehicle 10 and the radio wave shielding part of the wiring module 20 are electrically connected while the wiring module 20 is assembled to the vehicle 10. Accordingly, the present disclosure can also be considered to include the ground structure of the radio wave shielding part of the wiring module 20. The ground structure of the radio wave shielding part of the wiring module 20 includes the electrical connection part of connecting the metal part 13a and the radio wave shielding part. The electrical connection part may be a direct connection part where the metal part 13a and the conductive layer 32 have direct contact and are connected to each other. The electrical connection part may be an indirect connection part where the metal part 13a and the conductive layer 32 are connected via the connection member 80.

<Apparatus Incorporated into Wiring Module>

Some or all of the apparatuses 70 described above on the roof 14 may be incorporated into the wiring module 20. When some of the apparatuses 70 described above are incorporated into the wiring module 20, a combination of the apparatuses 70 incorporated into the wiring module 20 is optionally set. For example, the apparatus 70 relatively light in weight such as an internal communication antenna is preferably incorporated into the wiring module 20.

The apparatus 70 incorporated into the wiring module 20 may be attached to the functional sheet 30, for example. A position of fixing the apparatus 70 to the functional sheet 30 is optionally set. The apparatus 70 is preferably attached to a position appropriate for a role of the apparatus 70 on the functional sheet 30. For example, assuming that the apparatus 70 is a map lamp, the apparatus 70 is attached to a portion of the functional sheet 30 which is to be disposed in an obliquely upper front position of a front seat. For example, assuming that the apparatus 70 is an interior-side antenna, the apparatus 70 is attached to a portion of the functional sheet 30 which is to be disposed in an upper position of a front seat or a rear seat.

<Positional Relationship Between Functional Sheet and Apparatus>

The wiring module 20 includes the conductive layer 32, thus the external communication antenna unit 70B is preferably provided on an outer side of the vehicle on the conductive layer 32. Accordingly, an intervention of the conductive layer 32 between external communication antennas 73a and 73b and an external apparatus (a base station, for example) is suppressed at a time of wireless communication between the external communication antennas 73a and 73b and the external apparatus, and wireless communication between the apparatuses is favorably performed. In the present example, an antenna hole 13h is formed in the roof panel 13. The external communication antennas 73a and 73b are disposed in positions corresponding to the antenna hole 13h.

When the external communication antenna unit is disposed on the roof panel 13, a hole through which an antenna electrical wire passes is preferably formed in the roof panel 13 in place of the antenna hole 13h. When the roof panel 13 is formed of resin, for example, the external communication antenna unit may be disposed between the roof panel 13 and the functional sheet 30. In this case, the antenna hole 13h or a hole for passing an electrical wire needs not be limned in the roof panel 13.

The wiring module 20 includes the conductive layer 32, thus the interior-side antenna is preferably provided on an inner side of the vehicle on the conductive layer 32. Accordingly, the radio wave radiated from the interior-side antenna and an interior apparatus in the vehicle is shielded by the conductive layer 32, and is hardly transmitted to the outer side of the vehicle.

Based on a premise that the wiring module 20 includes the thermal adjustment layer 36, the apparatus 70 preferably includes a vehicle interior-side apparatus 70 provided on the inner side of vehicle in relation to the thermal adjustment layer 36. Assumed herein is that the apparatus 70 except for the external communication antenna unit 70B in the plurality of apparatuses 70 is the vehicle interior-side apparatus 70.

There is a possibility that a temperature of the roof 14 increases with sunlight. Heat by sunlight is blocked by the thermal adjustment layer 36, thus a temperature of an area on the vehicle interior side of the thermal adjustment layer 36 hardly increases compared with an area on the vehicle exterior side. Thus, when the apparatus 70 is provided in the area on the vehicle interior side of the thermal adjustment layer 36, increase in a temperature around the apparatus 70 can be suppressed. As a result, a member having high heat resistance needs not be used as the apparatus 70.

In the similar manner, when the electrical wire 40 is provided in the area on the vehicle interior side of the thermal adjustment layer 36, increase in a temperature of the electrical wire 40 can be suppressed. Accordingly, a member having high heat resistance needs not be used as the electrical wire 40.

The configuration in the present embodiment includes the apparatus 70 (for example, the electronic control unit 70A) disposed on the vehicle interior side of the functional sheet 30 and the apparatus 70 (for example, the external communication antenna unit 70B) disposed on the vehicle exterior side of the functional sheet 30. In the present embodiment, the electrical wire 40 is disposed on the vehicle interior side of the functional sheet 30. The electrical wire 40 is connected to the apparatus 70 at both surfaces of the functional sheet 30. The electrical wire 40 disposed on the vehicle interior side of the functional sheet 30 is connected as it is to the apparatus 70 disposed on the vehicle interior side of the functional sheet 30. The electrical wire 40 disposed on the vehicle interior side of the functional sheet 30 is connected as follows, for example, to an apparatus disposed on the vehicle exterior side of the functional sheet 30.

That is to say, an electrical wire insertion hole 30a passing through front and back sides of the functional sheet 30 is formed. An end portion of the electrical wire 40 disposed on the vehicle interior side of the functional sheet 30 is passed through the electrical wire insertion hole 30a and led to the surface of the functional sheet 30 on the vehicle exterior side. The connector C on the end portion of the electrical wire 40 is connector-connected to the apparatus 70, which is disposed on the vehicle exterior side, on an outer side of the surface of the functional sheet 30 on the vehicle exterior side.

Some or all of the apparatuses 70 on the vehicle interior side may be fixed to the roof panel 13 or the reinforcement bar 13a. In this case, the apparatus 70 on the vehicle interior side is fixed to the roof panel 13 or the reinforcement bar 13a as follows, for example. That is to say, an attachment hole 30b passing through the front and back sides of the functional sheet 30 is formed. A bolt, for example, is passed through the attachment hole to screw the apparatus 70 to the roof panel 13 or the reinforcement bar 13a.

Effect Etc. of Embodiment 1

According to the wiring module 20 having the above configuration, the conductive sheet 50A covering the first electrical wire 40A is electrically connected to the conductive layer 32 of the functional sheet 30, thus noise occurring in the first electrical wire 40A can be simply suppressed by the functional sheet 30 and the conductive sheet 50A.

The vehicle body side connection part which can be electrically connected to the metal part 13a in the vehicle body is provided on the conductive layer 32. Accordingly, the conductive sheet 50A and the functional sheet 30 can be connected to the metal part 13a of the vehicle body, and shielding effect of the conductive sheet 50A and the functional sheet 30 is increased.

The wiring module further includes the second electrical wire 40B disposed on one surface side of the functional sheet 30, and the conductive sheet 50A is provided between the first electrical wire 40A and the second electrical wire 40B. Accordingly, the first electrical wire 40A and the second electrical wire 40B are partitioned by the conductive sheet 50A, thus a noise problem between the first electrical wire 40A and the second electrical wire 40B is simply suppressed.

The conductive sheet 50A intervenes between the first electrical wire 40A and the second electrical wire 40B in the intersection part. Accordingly, the noise problem such as crosstalk between the first electrical wire 40A and the second electrical wire 40B can be simply suppressed also in the intersection part.

The functional sheet 30 and the conductive sheet 50 are electrically connected via the attachment 60. A member electrically connecting the functional sheet 30 and the conductive sheet 50 needs not be provided in addition to the attachment 60.

The conductive sheet 50B covers at least a portion of the connector C where the electrical wire 40 extends from a terminal of the connector C. The conductive sheet 50B covers a part of the electrical wire 40, thus noise occurring in the electrical wire 40 connected to the connector C can also be simply suppressed.

The conductive sheet 50 is provided to be partially overlapped with the functional sheet 30. Accordingly, a range in which the conductive sheet 50 is provided is made small.

The first electrical wire 40A is attached to the functional sheet 30. Accordingly, when the wiring module 20 is attached to the vehicle 10, the first electrical wire 40A can be integrally handled with the functional sheet 30.

Embodiment 2

Figure 8:
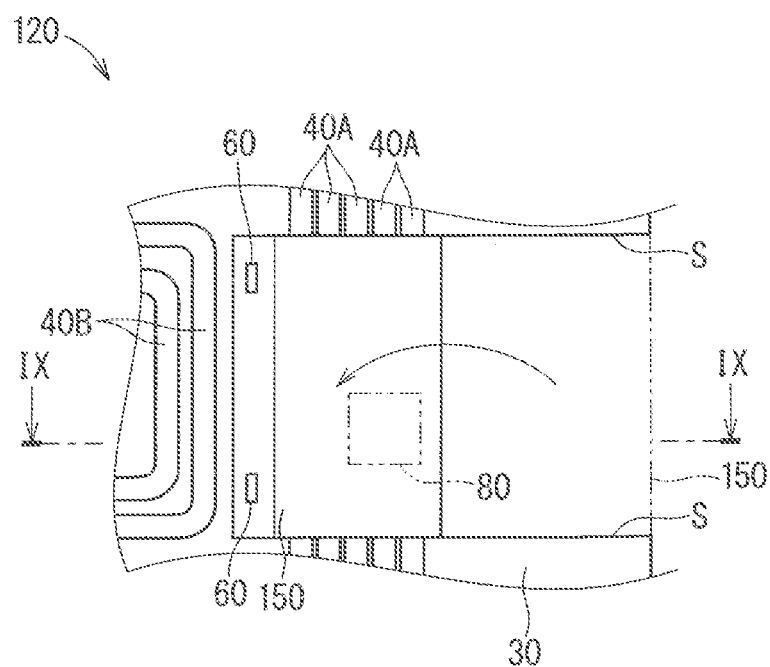
FIG. 8 is a plan view illustrating a wiring module according to an embodiment 2.
Figure 9:
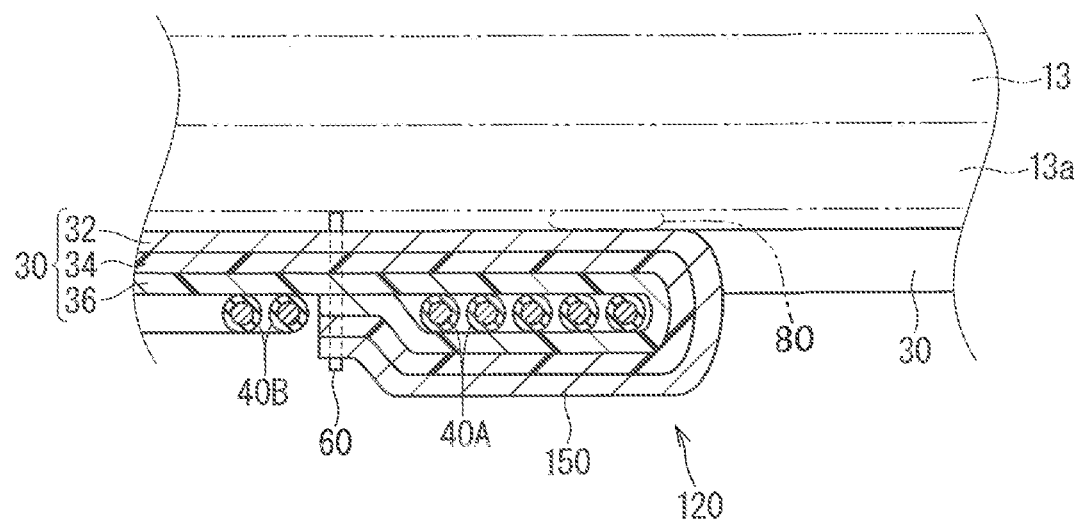
FIG. 9 is a cross-sectional view of the wiring module cut along an IX-IX line in FIG. 8.

A wiring module according to an embodiment 2 is described. FIG. 8 is a plan view illustrating a wiring module 120 according to the embodiment 2. FIG. 9 is a cross-sectional view of the wiring module cut along an IX-IX line in FIG. 8. In the following description of the present embodiment, the same reference numerals are assigned to the similar constituent elements described above, and the description thereof will be omitted.

The wiring module 120 is different from the wiring module 20 in that a conductive sheet 150 is integral with the conductive layer 32 of the functional sheet 30. In the wiring module 120, the conductive sheet 150 is provided by bending a part of the conductive layer 32 of a sheet constituting the functional sheet 30. Thus, the conductive sheet 150 and the conductive layer 32 are made by one sheet, thus an electrical connection state of the conductive sheet 150 and the conductive layer 32 is stabilized. A connection member electrically connecting the conductive sheet 150 and the functional sheet 30 can be omitted in a portion where one sheet is bended, thus increase in the number of components can be suppressed in the wiring module 120. In the example illustrated in FIG. 9, the other layers 34 and 36 in the sheet constituting the functional sheet 30 on a side of the conductive sheet 150 are also left. That is to say, the acoustic insulation layer 34 and the thermal adjustment layer 36 are overlapped with the conductive sheet 150. However, the layer other than the conductive layer 32 in the sheet constituting the functional sheet 30 in the conductive sheet 150 may be omitted.

In bending the sheet constituting the functional sheet 30, a slit S is formed in the sheet constituting the functional sheet 30 in the example illustrated in FIG. 8. In the example illustrated in FIG. 8, two slits S extend from an outer edge of the sheet constituting the functional sheet 30 toward an inner side. A portion of the sheet constituting the functional sheet 30 sandwiched by two slits S is folded to constitute a portion including the conductive sheet 150. A concave portion is formed in a portion of the functional sheet 30 folded to constitute the conductive sheet 150.

However, a shape of the slit S is not limited thereto described above. For example, one slit may be formed into a U-like shape or C-like shape in the sheet constituting the functional sheet. Then, a portion of the sheet constituting the functional sheet surrounded by the slit may be folded to constitute a portion including the conductive sheet. In this case, a through hole is formed in a portion of the functional sheet folded to constitute the conductive sheet.

The slit S needs not be formed in bending the sheet constituting the functional sheet 30. For example, a portion protruding to have a convex shape toward a lateral side may be provided in a part of the sheet constituting the functional sheet. Then, the portion of the sheet constituting the functional sheet protruding to have the convex shape may be folded to constitute a portion including the conductive sheet. In this case, a concave portion is hardly formed in a portion of the functional sheet folded to constitute the conductive sheet.

The wiring module 120 is the same as the wiring module 20 in that the conductive sheet 150 is provided between the first electrical wire 40A and the second electrical wire 40B. However, the wiring module 120 is different from the wiring module 20 in that the first electrical wire 40A and the second electrical wire 40B do not intersect with each other. Herein, the conductive sheet 150 is provided in a parallel route part of the first electrical wire 40A and the second electrical wire 40B.

Specifically, the parallel route part is provided in a part of the route in the first electrical wire 40A and the second electrical wire 40B. In the parallel route part, the first electrical wire 40A and the second electrical wire 40B are parallelly arranged with a mutually shorter distance than the other part of the route. Thus, a noise problem occurs more easily between the first electrical wire 40A and the second electrical wire 40B than the other part of the route in the parallel route part. The conductive sheet 150 is provided between the first electrical wire 40A and the second electrical wire 40B in the parallel route part, thus the noise problem occurring between the first electrical wire 40A and the second electrical wire 40B can be simply suppressed in the parallel route part.

In the example illustrated in FIG. 8, the first electrical wire 40A and the second electrical wire 40B are branched in both end portions of the parallel route part and mutually extend in different directions. The first electrical wire 40A and the second electrical wire 40B may be branched in one of the end portions of the parallel route part and mutually extend in different directions. In this case, the connector C may be provided in any other end portion of the parallel route part. That is to say, it is also applicable that the first electrical wire 40A and the second electrical wire 40B include portions parallelly extending from the same connector C, and the conductive sheet 150 may be provided in this portion.

A first parallel route part and a second parallel route part may be provided in the first electrical wire 40A and the second electrical wire 40B. The first electrical wire 40A and the second electrical wire 40B are parallelly arranged with a mutually shorter distance in the first parallel route part than in the second parallel route part. In this case, the conductive sheet 150 is preferably provided in the first parallel route part in the first parallel route part and the second parallel route part.

Additional Statement

An apparatus capable of optical communication may be provided as the apparatus 70 disposed on the roof 14. An optical communication cable such as an optical fiber may be provided in the wiring module 20 for the apparatus capable of optical communication. The optical communication cable may be arranged in parallel to the first electrical wire 40A or the second electrical wire 40B in at least a part of the route. A noise problem caused by electromagnetic induction hardly occurs between the optical communication cables and between the optical communication cable and the electrical wire, thus the conductive sheet needs not be provided therebetween.

Modification Example

In the above description, the electrical wire 40 includes the first electrical wire 40A and the second electrical wire 40B, however, this configuration is not necessary. For example, the second electrical wire 40B may be omitted.

In the above description, the transmission member is the electrical wire 40, however, this configuration is not necessary. The transmission member may be a conductive member other than the electrical wire 40. For example, the transmission member may be a bus-bar. For example, the transmission member may be a print circuit made by printing a conductive pattern. The conductive pattern may be directly printed on the functional sheet 30.

In the above description, the conductive sheets 50 and 150 are provided to be partially overlapped with the functional sheet 30, however, this configuration is not necessary. The conductive sheets 50 and 150 may be provided to be wholly overlapped with the functional sheet 30.

In the above description, the first electrical wire 40A and the second electrical wire 40B are attached to the functional sheet 30, however, this configuration is not necessary. One of or both the first electrical wire 40A and the second electrical wire 40B need not be attached to the functional sheet 30. The electrical wire 40 which is not attached to the functional sheet 30 may be in a state of being disposed along the functional sheet 30 by a self-weight, for example. The electrical wire 40 which is not attached to the functional sheet 30 may be in a state of being attached to the other member on an outer side of both sides of the functional sheet 30 to be disposed along the functional sheet 30, for example.

In the above description, the attachment 60 attaching the functional sheet 30 and the conductive sheets 50 and 150 is included, however, this configuration is not necessary. The functional sheet 30 and the conductive sheets 50 and 150 may be fixed to each other by a member other than the attachment 60. The functional sheet 30 and the conductive sheets 50 and 150 may be fixed to each other by a conductive adhesive agent, for example. In this case, it is preferable that the other layer is not provided between the conductive layer 32 and the conductive sheet 50 or between the conductive layer 32 and the metal part in the functional sheet 30.

The configurations described in the embodiments and modification examples thereof can be appropriately combined as long as they are not contradictory.

EXPLANATION OF REFERENCE SIGNS 10 vehicle
12 body
13 roof panel
13a reinforcement bar
13h antenna hole
14 roof
16 interior member
20 wiring module
30 functional sheet
30a electrical wire insertion hole
30b apparatus attachment hole
32 conductive layer
34 acoustic insulation layer
36 thermal adjustment layer
40 electrical wire
40A first electrical wire
40B second electrical wire
42 core wire
44 covering layer
50, 50A, SOB, 150 conductive sheet
60 attachment
61 first contact part
62 second contact part 63 connection part
70, 70A, 70B apparatus
72a, 72b external communication antenna
C connector
S slit

The invention claimed is:

1. A wiring module, comprising:
a functional sheet disposed between a panel and an interior member in a vehicle;
a transmission member disposed on one surface side of the functional sheet;
a second transmission member disposed on one surface side of the functional sheet, and
a conductive sheet covering a part of the transmission member, wherein
the functional sheet includes a conductive layer and a layer having a function of at least one of a thermal adjustment function or a sound insulation function,
the conductive sheet is electrically connected to the conductive layer,
the conductive sheet is provided between the transmission member and the second transmission member,
the transmission member and the second transmission member intersect at an intersection part, and
the conductive sheet intervenes between the transmission member and the second transmission member in the intersection part.

2. The wiring module according to claim 1, wherein the conductive layer is provided with a vehicle body side connection part which can be electrically connected to a metal part in a vehicle body.

3. The wiring module according to claim 1, wherein the conductive sheet is provided by bending a part of a conductive layer of a sheet constituting the functional sheet.

4. The wiring module according claim 1, wherein a connector provided in an end portion of the transmission member is disposed on the functional sheet, and the conductive sheet covers at least a portion of the connector from which the transmission member extends.

5. A wiring module, comprising:
a functional sheet disposed between a panel and an interior member in a vehicle;
a transmission member disposed on one surface side of the functional sheet;
a conductive sheet covering a part of the transmission member; and,
an attachment formed by a material having conductivity, wherein
the functional sheet includes a conductive layer and a layer having a function of at least one of a thermal adjustment function or a sound insulation function,
the conductive sheet is electrically connected to the conductive layer,
the attachment includes a first contact part and a second contact part mutually connected to each other, and
the first contact part has contact with the conductive sheet, and the second contact part has contact with the conductive layer, thereby fixing the functional sheet and the conductive sheet.

6. The wiring module according to claim 5, further comprising
a second transmission member disposed on one surface side of the functional sheet, wherein
the conductive sheet is provided between the transmission member and the second transmission member.

7. The wiring module according to claim 6, wherein the transmission member and the second transmission member intersect at an intersection part, and
the conductive sheet intervenes between the transmission member and the second transmission member in the intersection part.

* * * * *